United States Patent [19]
Wakabayashi et al.

[11] Patent Number: 5,311,056
[45] Date of Patent: May 10, 1994

[54] SEMICONDUCTOR DEVICE HAVING A BI-LEVEL LEADFRAME

[75] Inventors: Shinichi Wakabayashi; Akihiko Murata, both of Nagano, Japan

[73] Assignee: Shinko Electric Industries Co., Ltd., Nagano, Japan

[21] Appl. No.: 989,954

[22] Filed: Dec. 10, 1992

Related U.S. Application Data

[63] Continuation of Ser. No. 782,735, Oct. 28, 1991, abandoned, which is a continuation of Ser. No. 424,731, Oct. 20, 1989, abandoned.

[30] Foreign Application Priority Data

Oct. 21, 1988 [JP] Japan ................... 63-266774

[51] Int. Cl.[5] ............... H01L 23/48; H01L 29/44; H01L 29/52; H01L 29/60
[52] U.S. Cl. ................... 257/666; 257/668; 257/670; 257/672; 257/692; 257/698; 257/734
[58] Field of Search ............... 357/80, 70, 74; 257/666, 667, 670, 671, 674, 692, 695, 698, 734, 773, 774, 672, 668, 669

[56] References Cited

U.S. PATENT DOCUMENTS

| | | | |
|---|---|---|---|
| 4,571,354 | 2/1986 | Maxwell | 257/670 |
| 4,796,078 | 1/1989 | Phelps, Jr. et al. | 357/70 |
| 4,874,086 | 10/1989 | Imamura et al. | 357/70 |
| 4,937,656 | 6/1990 | Kohara | 357/70 |
| 4,967,260 | 10/1990 | Butt | 357/74 |
| 4,987,475 | 1/1991 | Schlesinger et al. | 357/70 |

FOREIGN PATENT DOCUMENTS

| | | | |
|---|---|---|---|
| 58-122763 | 7/1983 | Japan . | |
| 0241243 | 11/1985 | Japan | 357/70 |

*Primary Examiner*—Andrew J. James
*Assistant Examiner*—Carl Whitehead, Jr.
*Attorney, Agent, or Firm*—Staas & Halsey

[57] ABSTRACT

A lead frame for a semiconductor device includes a resin base film having opposed surfaces and an opening therein. A plurality of inner leads are formed of a metal foil on one surface of the film in a desired inner lead circuit pattern that includes inner edges arranged for connection to a semiconductor device mounted on the film and outer edges positioned over the opening. A plurality of outer leads are formed of a metal sheet and adhered to the other surface of the film in a desired outer lead circuit pattern that includes inner edges positioned over the opening and outer edges that extend outwardly from the frame.

4 Claims, 3 Drawing Sheets

SEMICONDUCTOR DEVICE HAVING A BI-LEVEL LEADFRAME

This application is a continuation of application Ser. No. 07/782,735, filed Oct. 28, 1991, abandoned; which is a continuation of application Ser. No. 07/424,731, filed Oct. 20, 1989, abandoned.

BACKGROUND OF THE INVENTION

1. Field of the Invention

The present invention relates to lead frames and methods for producing the same, and in particular, the invention relates to lead frames for small semiconductor devices; having a large number of pins and to and an effective method for producing such frames.

2. Description of the Related Art

Lead frames used in resin mold type semiconductor devices are formed with a desired wiring pattern by stamping and etching metal sheets from sheet metal strips.

The density of semiconductor devices now in use has been greatly increased, and the size of the packages which include semiconductor devices has been greatly reduced. Accordingly, lead frames having inner and outer leads which are electrically connected to semiconductor devices must have a large number of pins.

It is well known that the width of the portions removed by stamping and etching is essentially the same as; the thickness of the metal sheet. Further, metal sheets which are too thin cannot be used, because this lowers the strength of the outer leads, and thus the number of pins provided by the lead frame for connection to a semiconductor device is limited.

Conventionally, lead frames prepared from metal sheets having a thickness of about 0.1 mm are limited to about 160 pins. Recently, however, a need has arisen for lead frames having more than 180 pins, and this need has been met by spacing the top ends of the inner leads from the semiconductor device, whereby it is possible to increase the number of pins or leads provided by the lead frame. This arrangement, however, results in a lengthening of the wire bonding distance between the semiconductor device and an the spaced inner leads, and thus problems arise with regard to wire bonding and the size of the semiconductor package is increased.

SUMMARY OF THE INVENTION

Therefore, an object of the present invention is to provide lead frames whereby the above-mentioned problems are solved.

Another object of the present invention is to provide lead frames having a large number of pins and a small size.

A further object of the present invention is to provide a method for producing such lead frames.

Accordingly, the present invention provides a lead frame for a semiconductor device. The lead frame comprises a resin base film having opposed surfaces and an opening therein. The lead frame also includes a plurality of inner leads formed of a metal foil and disposed on one surface of the film in a desired inner lead circuit pattern that includes inner edges arranged for connection to a semiconductor device mounted on the film and outer edges positioned over the opening in the resin base film. The lead frame further includes a plurality of outer leads formed of a metal sheet and adhered to the other surface of the film in a desired outer lead circuit pattern that includes inner edges positioned over said opening and outer edges that extend outwardly from the frame.

The invention also provides a method for producing a lead frame comprising the steps of providing a resin base film having opposed surfaces; forming first and second openings in the film; adhering a metal foil to one side of the film and filling the openings with a removable resist. The method of the invention further comprises the steps of adhering a metal sheet to the other side of the film and etching the metal foil to form a plurality of inner leads and present an inner lead circuit pattern including inner edges arranged for connection to a semiconductor device mounted on the film and outer edges positioned over one of the openings. Further the method includes the steps of forming a plurality of outer leads from the metal sheet to present an outer lead circuit pattern including inner edges positioned over the said one of the openings and outer edges positioned over the other opening. Also included in the method are the steps of removing the resist from the openings and connecting the outer edges of the inner lead circuit pattern with corresponding inner edges of the outer lead circuit pattern through said one of said openings.

In one aspect of the invention the step of forming a plurality of outer leads includes the step of etching the metal sheet after the same is adhered to the other side of the film. In another aspect of the invention the step of forming a plurality of outer leads includes the step of stamping said metal sheet after the same is adhered to the other side of the film. And in yet another aspect of the invention the step of forming a plurality of outer leads includes the step of stamping the metal sheet before the same is adhered to the other side of the film.

BRIEF DESCRIPTION OF THE DRAWING

FIGS. 1 to 5 illustrate a process for of the production of lead frames according to the present invention, wherein:

DESCRIPTION OF THE PREFERRED EMBODIMENTS

A preferred method for producing a lead frames according to the present invention is described with reference to the drawings. The structure of the lead frames will be understood from the description of the method.

Figure 1:
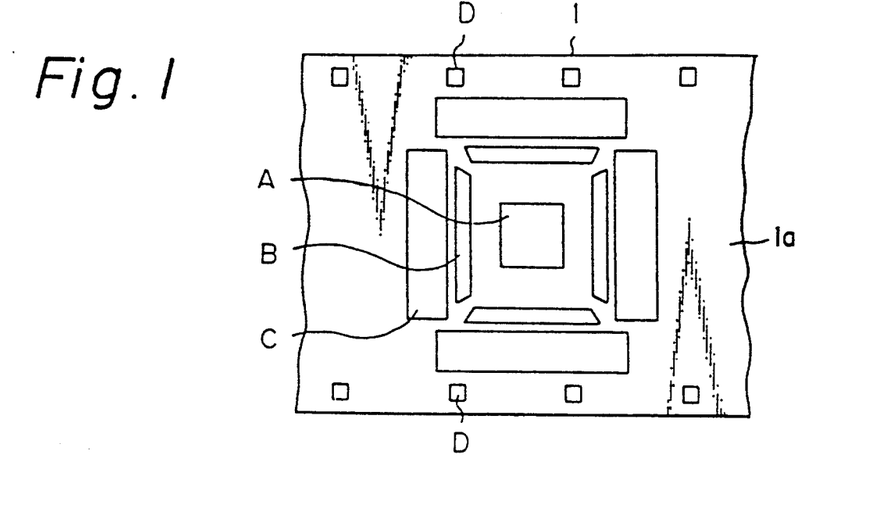
FIG. 1 is a plan view showing openings formed in a resin base film.

First, as shown in FIG. 1, openings A, B, and C are formed respectively in a heat resistant base film 1 of a resin such as a polyimide resin at positions corresponding to the places where the chip or device will be mounted, where the inner and outer leads are to be connected, and where the outer edges of the outer leads will be formed by pulling during a stamping process.

Further, film sprocket holes D are formed at each side of the resin base film 1.

The base film 1 preferably has a thickness, for example, of about 50 μm.

Figure 2:
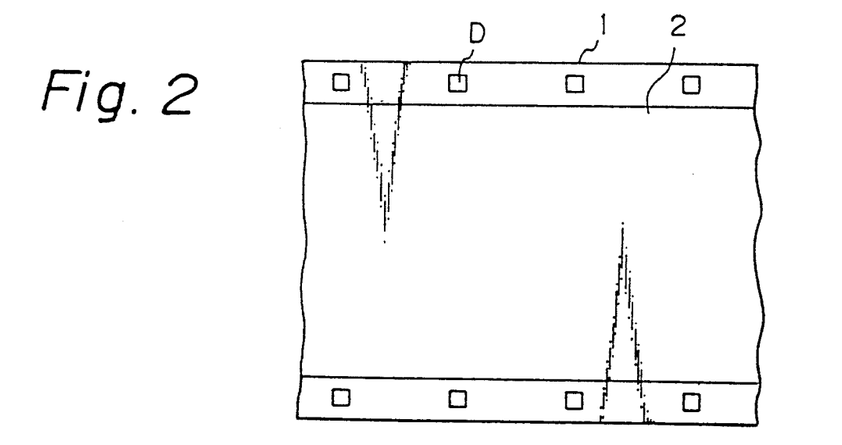
FIG. 2 is a plan view showing a metal foil adhered to one side of the resin base film.

The top surface 1a on one side of the base film 1 and the bottom surface 1b on the opposite side of the base film 1 (see FIG. 3) are each coated with a thermosetting adhesive, and as shown in FIG. 2, a metal foil 2 of copper or the like is heated and adhered to top surface 1a of the base film 1 over the openings A, B, and C. The metal foil 2 of substantially the same thickness as the metal foil used as the tape carrier for tape automated bonding (TAB) procedures, and preferably, the thickness of the metal foil 2 is 18 μm or 36 μm.

Figure 3:
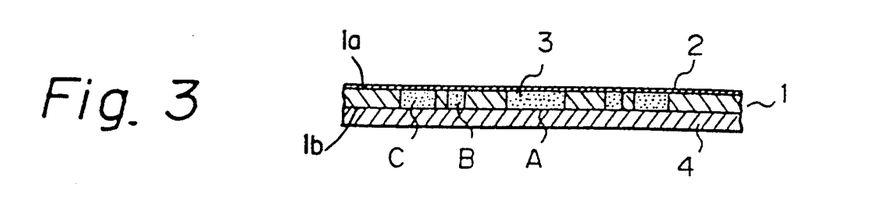
FIG. 3 is a cross sectional view showing the openings filled with a resist and a metal sheet adhered to the other side of the resin base film.

Then, as shown in FIG. 3 a resist 3 is formed in the openings A, B and C.

Resist 3 preferably is a resist which can be removed by chemical treatment, and for example, is a photo resist of the type used in an etching process. Then, a metal sheet 4 is adhered to the bottom surface 1b of the base film 1 so as to cover the entirety of bottom surface 1b leaving sprocket holes D open. Preferably the metal sheet 4 is formed from a material conventionally used for lead frames and, for example, is a copper alloy 42 sheet having a thickness of 100 to 150 μm.

Then a photoetching process is carried out whereby an inner lead circuit pattern is formed in the metal foil 2 and an outer lead circuit pattern is formed in the metal sheet 4. This photoetching process can be precisely carried out by positioning the base film 1 using the sprocket holes D, and exposing and developing the resist 3.

Figure 4:
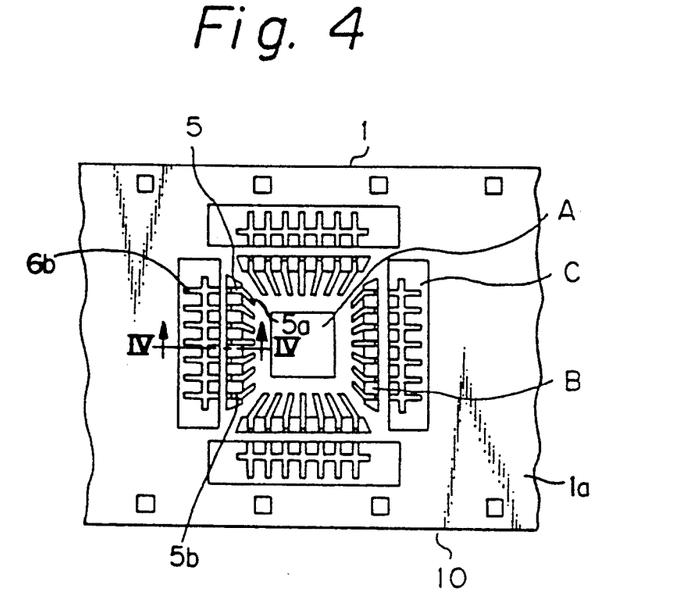
FIG. 4 is a plan view showing a metal foil etched to form an inner lead circuit pattern.
Figure 5:
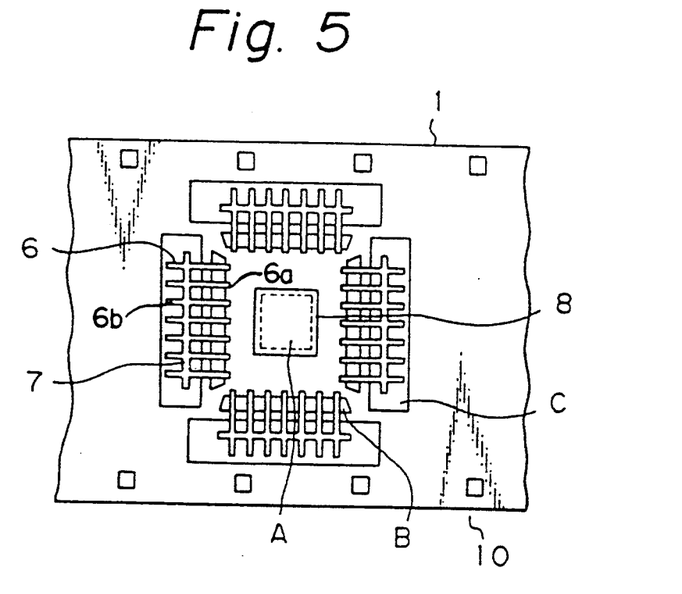
FIG. 5 is a plan view showing a metal sheet etched to form an outer lead circuit pattern.
Figure 6:
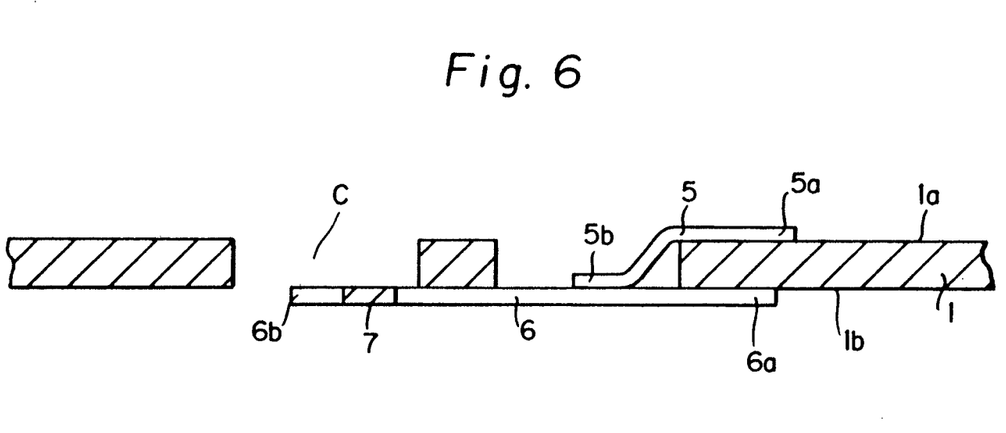
FIG. 6 is a cross-sectional view taken along the line VI—VI of FIG. 4.

As shown in FIG. 4, the inner leads 5 are formed in such a manner that the inner edges thereof do not reach the opening A. Namely, the inner leads 5 are positioned on top surface 1a of the base film 1 as shown in FIGS. 4, 5 and 6. Moreover, the outer leads 6 are positioned on bottom surface 1b of the base film 1 as clearly shown in FIG. 6. With further reference to FIG. 6, openings B and C are illustrated therein and it can also be seen that the outer edges 5a of the inner leads 5 and the inner edges 6a of the outer leads 6 are positioned over the opening B and the outer edges 6b of the outer leads 6 are positioned over the opening C.

In FIGS. 4 and 5 a dam bar 7, which is cut out later, is provided between the inner leads 5 and the outer leads 6.

Further, a die pad 8 is provided in a position corresponding to the opening A. In this case, the inner edges of the inner leads 5 may be connected to the die pad 8.

Then the resist 3 in the openings A, B, and C is removed by dissolving the same with an alkaline solution. Thereafter the outer edges of the inner leads 5 positioned over the opening B, are connected to outer leads 6 by spot welding or the like.

Then a plating process is carried out, as required, on the surfaces of the inner edges of the inner leads 5, whereby the lead frame is completed as shown in FIGS. 4 and 5.

Further by joining parts of each neighboring circuit pattern together, desired portions may be continuously plated by the well known reel-to-reel process.

The inner leads 5 can be connected to the outer leads 6 by thermalcompression or via through-holes in a polyimide layer made conductive by copper plating thereof.

According to this embodiment, since the inner leads 5 can be formed by etching the metal foil 2, the lead frame 1 can be provided with a very fine pattern. Further the inner leads 5 are arranged so that they can be electrically connected to a semiconductor device mounted on the die pad 8 using a wire bonding process, and therefore, the width of the inner leads 5 is limited only by bonding conditions and the need to provide a secure bonding area. During the wire bonding process the inner edges of the inner leads 5 are supported by the base film 1, and therefore the wire bonding process can be advantageously carried out even when the inner leads 5 are thin and very small.

In the foregoing description the metal sheet 4 is etched to form the outer leads 6 and the die pad 8, but the outer leads 6 and the die pad 8 could as well be peformed by stamping and thereafter positioned on and adhered to the base film 1. Further, the die pad 8 could be formed by stamping, and thereafter the same may be positioned on the base film 1 to cover the opening A. The die pad 8 may also be formed from a resin sheet instead of a metal sheet.

Since the die pad 8 can be mounted during the assembly of the semiconductor device, it is not necessary to provide the die pad 8 when producing the lead frame 1.

The portions of sheet 4 in positions corresponding to the openings B and C can be formed by stamping either before or after the metal sheet 4 is adhered to the base film 1. Portions of sheet 4 positioned on the base film 1 which cannot be stamped can be formed by etching to make outer leads 6. In the embodiment described above an opening A is formed in the base film 1, however this opening A can be omitted when a semiconductor element is to be fixed on the base film 1 by an adhesive. Further since the inner leads 5 of the lead frame according to the present invention are formed by etching the thin metal foil 2, these inner leads 5 can be formed in a very fine pattern, and thus a very compact multi-pin lead frame can be provided.

Further, since the inner edges of the inner leads 5 are fixed to the resin base film 1, even though these leads 5 are made of a thin metal foil, deformation of the leads 5 is avoided and a strong connection between the wires and the inner leads may be obtained using an ultrasonic wire bonding process, since the energy of the ultrasonic waves is not dispersed.

We claim:

1. A lead frame for a semiconductor device comprising:
   a resin base film having first and second surfaces and an opening therein;
   a plurality of inner leads positioned on said first surface of the film in a desired inner lead circuit pattern that includes a plurality of inner end portions arranged for connection to a semiconductor device mounted on the film and a plurality of outer end portions positioned at said opening; and
   a plurality of outer leads positioned on the second surface of the film in a desired outer lead circuit pattern that includes a plurality of inner end portions positioned at said opening and a plurality of outer end portions projecting outwardly of said frame, the outer end portions of said inner lead circuit pattern being electrically connected to corresponding inner end portions of said outer lead circuit pattern through said opening.

2. A lead frame as set forth in claim 1, wherein said film has a second opening therein located at a device mounting position.

3. A lead frame as set forth in claim 2, wherein is included a die pad affixed on said second surface of the film at said second opening.

4. A lead frame as set forth in claim 1, wherein is included a dam bar on the outer leads for preventing leakage of sealing resin onto the outer leads.

* * * * *

UNITED STATES PATENT AND TRADEMARK OFFICE
CERTIFICATE OF CORRECTION

PATENT NO. : 5,311,056

DATED : May 10, 1994

INVENTOR(S) : SHINICHI WAKABAYASHI ET AL.

It is certified that error appears in the above-indentified patent and that said Letters Patent is hereby corrected as shown below:

Column 1, line 15, delete ";" and delete second occurrence of "and";

line 44, delete "an";

line 63, delete "inner edges" and substitute --plurality of inner end portions--;

line 64, after "and" insert --a plurality of-- and after "outer" insert --end portions--;

line 65, delete "edges" and "over" and substitue --at--.

Column 2, line 1, after "includes" insert --a plurality of-- and delete "edges" and substitute --end portions-- and "over" and substitute --at--;

line 2, delete "extend" and substitute --project-- and "from" and substitute --of-- and after "frame." insert --The outer end portions of the inner lead circuit pattern are

UNITED STATES PATENT AND TRADEMARK OFFICE
CERTIFICATE OF CORRECTION

PATENT NO. : 5,311,056
DATED : May 10, 1994
INVENTOR(S) : SHINICHI WAKABAYASHI ET AL.

It is certified that error appears in the above-indentified patent and that said Letters Patent is hereby corrected as shown below:

electrically connected to corresponding inner portions of the outer lead circuit pattern through the opening.--;

line 12, delete "edges" and substitute-- end portions --.

line 14, delete "edges" and substitute --end portions-- and "over" and substitute --at--;

line 17, delete "edges" and substitute --end portions--;

line 18, delete "over the" and substitute --at-- and "edges" and substitute --end portions--;

line 19, delete "over" and substitute --at --.

portions--;

line 21, delete "edges" and substitute --end portions--;

line 22, delete "edges" and substitute --end portions--;

line 28, after "invention" insert --,--;

UNITED STATES PATENT AND TRADEMARK OFFICE
CERTIFICATE OF CORRECTION

PATENT NO. : 5,311,056

DATED : May 10, 1994

INVENTOR(S) : SHINICHI WAKABAYASHI ET AL.

It is certified that error appears in the above-indentified patent and that said Letters Patent is hereby corrected as shown below:

line 30, delete "is" and substitute --has been--;

line 32, after "invention" insert --,--;

line 34, delete "is" and substitute --has been--;

line 38, delete "5" and substitute --6-- and after "illustrate" insert --lead frames and-- and delete "of";

line 45, delete "cross sectional" and substitute --cross-sectional--;

line 57, delete "a";

line 67; delete "edges" and substitute --ends--.

Column 3, line 10, after "2" insert --is--;

line 12, after "(TAB)" insert --,--;

line 13, delete "18" and substitute --10--;

line 17, delete "photo resist" and substitute --photoresist--;

UNITED STATES PATENT AND TRADEMARK OFFICE
CERTIFICATE OF CORRECTION

PATENT NO. : 5,311,056

DATED : May 10, 1994

INVENTOR(S): SHINICHI WAKABAYASHI ET AL.

It is certified that error appears in the above-indentified patent and that said Letters Patent is hereby corrected as shown below:

line 32, delete "edges" and sibstitute --end portions 5a--;

line 33, delete "Namely" and substitute --That is to say--;

line 35, delete ", 5";

line 36, after "as" insert --is--;

line 37, delete "FIG." and substitute --FIGS. 4, 5 and-- (both occurrences);

line 38, delete "also";

line 39, delete "edges" and substitute --end portions-- and line 40, delete "edges" and substitute --end portions--and "over" and substitute --at--;

line 41, after "and" insert --that and delete "edges" and substitute --end portions--;

line 42, "over the" and substitute --at--;

UNITED STATES PATENT AND TRADEMARK OFFICE
CERTIFICATE OF CORRECTION

PATENT NO. : 5,311,056

DATED : May 10, 1994

INVENTOR(S) : SHINICHI WAKABAYASHI ET AL.

It is certified that error appears in the above-indentified patent and that said Letters Patent is hereby corrected as shown below:

line 43, delete "cut out" and after "later" insert --removed--;

line 47, delete "edges" and substitute --end portions 5a --.

line 49, delete "Then the" and substitute --The--;

line 51, delete "edges" and substitute --end portions 5b--.

line 51, delete "edges" and substitute --end portions 56--;

line 52, delete "over" and substitute --at-- and delete "," and after "to" insert --corresponding inner end portions 6a of--;

line 54, delete "a" and substitute --,--;

line 55, delete "edges" and substitute --end portions 5a--;

line 62, delete "thermalcompression" and substitute --thermal compression--.

UNITED STATES PATENT AND TRADEMARK OFFICE
CERTIFICATE OF CORRECTION

PATENT NO. : 5,311,056
DATED : May 10, 1994
INVENTOR(S) : Shinichi Wakabayashi et al It is certified that error appears in the above-indentified patent and that said Letters Patent is hereby corrected as shown below:

Column 4, line 4, delete "edges" and substitute --end portions 5a--;

line 11, delete "peformed" and substitute --preformed--;

line 24, delete "leads" and substitute --lead-- and after "above" insert --,--;

line 25, delete ", however this" and substitute --. However, --.

UNITED STATES PATENT AND TRADEMARK OFFICE
CERTIFICATE OF CORRECTION

PATENT NO. : 5,311,056
DATED : May 10, 1994
INVENTOR(S) : Shinichi Wakayashi et al It is certified that error appears in the above-indentified patent and that said Letters Patent is hereby corrected as shown below:

Column 4, line 28, after "Further" insert --,--;

line 29, delete "the" (second occurrence) and substitute --a--;

line 33, delete "edges" and substitute --end portions 5a--.

Signed and Sealed this

Thirtieth Day of April, 1996

BRUCE LEHMAN

Attest:

Attesting Officer

Commissioner of Patents and Trademarks